United States Patent [19]

Rohner

[11] Patent Number: 5,547,902
[45] Date of Patent: Aug. 20, 1996

[54] POST HOT WORKING PROCESS FOR SEMICONDUCTORS

[75] Inventor: Don Rohner, Austin, Tex.

[73] Assignee: Advanced Micro Devices, Inc., Sunnyvale, Calif.

[21] Appl. No.: 375,414

[22] Filed: Jan. 18, 1995

[51] Int. Cl.$^6$ ............................................. H01L 21/44
[52] U.S. Cl. ........................... 437/187; 437/180; 437/203
[58] Field of Search ................................... 437/180, 187, 437/203, 225, 247, 248; 29/874, 852, 853

[56] References Cited

U.S. PATENT DOCUMENTS

| | | | |
|---|---|---|---|
| 3,727,290 | 4/1973 | Schaumburg | 29/407 |
| 4,412,642 | 11/1983 | Fisher, Jr. | 29/874 |
| 4,906,823 | 3/1990 | Kushima et al. | 29/882 |
| 5,011,793 | 4/1991 | Obinata | 437/79 |
| 5,073,518 | 12/1991 | Doan et al. | 437/225 |
| 5,127,146 | 7/1992 | Wittenauer | 29/423 |
| 5,308,792 | 5/1994 | Okabayashi et al. | 437/228 |

FOREIGN PATENT DOCUMENTS 0099216  4/1989  Japan.

Primary Examiner—Tuan H. Nguyen
Attorney, Agent, or Firm—Foley & Lardner

[57] ABSTRACT

A post-hot metal deposition process applied to semiconductor wafer manufacturing in order to increase the size of grain structures and improve electromigration resistance in semiconductor devices. A highly ductile metal is first deposited onto a semiconductor substrate having contact points in a partial vacuum. A forge is applied to the substrate—with the highly ductile metal deposited thereon, to form a smooth conductive surface on the substrate, even at the contact points. The forging is done at an appropriate pressure and temperature to perform hot-working of the metal onto the contact points of the substrate. The forge may be used to emboss a conductor image of the highly ductile metal deposited on the substrate. The forging process may be performed by either stamping a surface onto the substrate or by rolling a surface onto the substrate.

34 Claims, 5 Drawing Sheets

FIG. 6

|  | K |  | n |
|---|---|---|---|
|  | psi = 10³ | MPa |  |
| Aluminum, 1100-O | 26 | 180 | 0.20 |
| 2024-T4 | 100 | 690 | 0.16 |
| 5052-O | 30 | 210 | 0.13 |
| 6061-O | 30 | 205 | 0.20 |
| 6061-T6 | 80 | 410 | 0.06 |
| 7075-O | 58 | 400 | 0.17 |
| Brass, 60-39-1 Pb, annealed | 115 | 800 | 0.33 |
| 70-30, annealed | 130 | 895 | 0.48 |
| 85-15, cold-rolled | 84 | 580 | 0.34 |
| Bronze (phosphor), annealed | 105 | 720 | 0.46 |
| Cobalt-base alloy, heat-treated | 300 | 2070 | 0.50 |
| Copper, annealed | 46 | 315 | 0.54 |
| Molybdenum, annealed | 105 | 725 | 0.13 |
| Muntz metal, annealed | 115 | 800 | 0.50 |
| Steel, low-carbon annealed | 77 | 530 | 0.26 |
| 1046 hot-rolled | 140 | 965 | 0.14 |
| 1112 annealed | 110 | 760 | 0.19 |
| 1112 cold-rolled | 110 | 760 | 0.08 |
| 4135 annealed | 147 | 1015 | 0.17 |
| 4135 cold-rolled | 160 | 1100 | 0.14 |
| 4340 annealed | 93 | 640 | 0.15 |
| 17-4 P-H annealed | 175 | 1200 | 0.05 |
| 52100 annealed | 210 | 1450 | 0.07 |
| 302 stainless, annealed | 190 | 1300 | 0.30 |
| 304 stainless, annealed | 186 | 1275 | 0.45 |
| 410 stainless, annealed | 140 | 960 | 0.10 |
| Vanadium, annealed | 112 | 770 | 0.36 |

POST HOT WORKING PROCESS FOR SEMICONDUCTORS

BACKGROUND OF THE INVENTION

1. Field of the Invention

This invention relates to applying a post-hot metal deposition process to semiconductor wafer manufacturing, in order to increase the size of grain structures and improve electromigration resistance in semiconductor devices.

2. Description of the Related Art

Currently, in the manufacturing of semiconductor devices, the process of filling in contact voids with a conductive metal layer is done using conventional etching techniques and pillar techniques. Conventional etching techniques using Aluminum (Al) are well known in the art for applying a conductive pattern to a semiconductor device. Conventional pillar techniques fill in contacts on the semiconductor device with seed material, such as Titanium. Such conventional pillar techniques are very complicated, and result in very expensive deposition procedures.

In a conventional pillar technique, a seed material is deposited onto a substrate. Next, a layer of tungsten is deposited on top of the seed material. Some amount of tungsten must be ground off of the seed material at this stage to arrive at the proper thickness of tungsten on the seed material. As a result, the pillar technique is an expensive and time consuming process for depositing a conductive layer onto a semiconductor substrate and for filling in contact voids on the semiconductor substrate.

A conventional method of etching copper (Cu) onto a substrate is to first put down a very thick oxide image at locations where the copper conductor will be placed onto the substrate. An oxide path is opened up and copper is deposited onto the oxide image. The copper is then ground down all the way to the top of the oxide image where the conductor opening is located. Like the pillar techniques described above, this etching technique is also very complex and expensive.

Since copper has about twice the conductivity of Aluminum, copper as a conducting material for semiconductor ICs is becoming more desirable. The small sizes of IC components make this higher conductivity a useful characteristic. However, conventional techniques for applying copper onto semiconductor substrates present many problems, since Cu cannot easily be etched onto semiconductor substrates. Currently, there is no way of keeping the resistance of the Cu metal viable throughout the etching of the Cu onto the semiconductor substrate.

SUMMARY OF THE INVENTION

Accordingly, it is a general object of the invention to provide a process to deposit conductive metals, such as Copper and Aluminum, onto contact openings of semiconductor substrates in a less costly and less complex manner than what is currently available.

It is a further general object of the invention to ensure that the resistance of the conductive metal is viable throughout the entire semiconductor substrate.

It is still another general object of the invention to provide a hot working technique that can be applied to deposit highly ductile metals onto semiconductor substrates in a simple and cost-effective manner.

In accordance with these and other objectives, a method according to the invention provides a post hot working technique applied to semiconductors.

In accordance with this object, there is provided a method for depositing a ductile metal onto a semiconductor substrate having a plurality of contact openings on the semiconductor substrate. The method includes depositing the ductile metal on the substrate in a partial vacuum. The ductile metal is compressed onto the substrate in a full vacuum and at a temperature range between a first and a second temperature and at a first pressure. The substrate is then cooled off, to thereby allow the ductile metal to form a conductive surface on the substrate with a desired characteristic. That desired characteristic is such that the ductile metal is thereby formed onto the substrate as a smooth surface with no indentations where the contact openings are located.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 6 lists typical strength coefficient values and strain-hardening exponent values for various types of metals at room temperature.

DETAILED DESCRIPTION OF THE PREFERRED EMBODIMENTS

A hot working metal has been applied to a surface in heavy industry. Hot working is normally performed in large vacuum chambers or in inert gas environments, and is a technique used to produce thin metal sections, such as metallic foils, from large-width metal pieces. Metallic foils have also been manufactured by flame-spraying a molten metal onto a surface. These methods employ release agents, such as fluoride salts, onto the surface, in order to facilitate removal or stripping of the foil from the surface.

For example, U.S. Pat. No. 3,727,290, to Georges Schaumburg, describes a method for processing a hot-rolled metal body to apply an enamel coating, which is used to indicate the presence of flaws in the metal to which the coating is applied and also to indicate the presence of scaling as the metal body cools. This patent discloses that the process of hot-rolling a metal body to re-form the metal is known in the metallurgical art. In general, the metal is heated to a temperature just below its melting point, and then the metal is shaped in a particular way. The metal is then cooled down, and the reshaped metal is rigidly formed into its new shape.

Also, U.S. Pat. No. 5,127,146, to Jerome Wittenauer, discloses a post-hot rolling technique for forming thin metal sections of reactive metals for preventing high-temperature accelerated corrosion during the hot working procedure. By the procedure disclosed by Wittenauer, oxidation and other degradations of the reactive metal section during the hot working process are prevented.

Even though the post-hot working process applied to large-size metals is known in the metallurgical art and well utilized in heavy industry, to date such techniques have not been usefully applied to semiconductors. The semiconductor industry typically works with much smaller dimension materials than those typically used in heavy industry. These smaller dimension materials include micron-size components for integrated circuit (IC) design.

For various reasons, including a misunderstanding about the fragility of semiconductor materials during the fabrication process, the lack of appropriate equipment, and a failure by the semiconductor industry to recognize the applicable temperature and pressures, hot working of metals has not been applied in the semiconductor field to deposit and compress ductile metals onto contact openings of semiconductor substrates to form smooth conductive surface at these contact openings. The methods and apparatus according to the invention disclosed herein provide several techniques that work towards this end.

In the first embodiment of the invention, a conductive, ductile metal, such as aluminum or copper, is compressed onto a semiconductor substrate by a forge mechanism in a vacuum chamber under specified temperature and pressure conditions.

Figure 1:
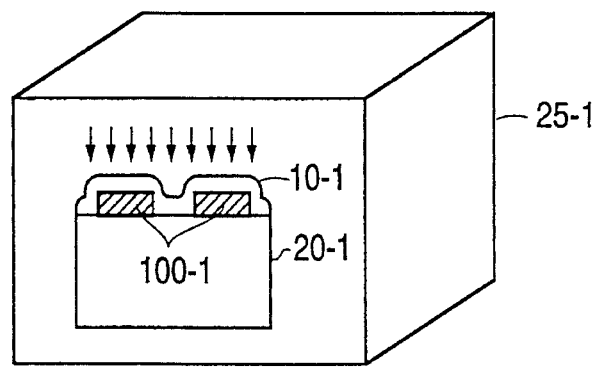
FIG. 1 shows the deposition step of the post-hot working process according to the invention.
Figure 2:
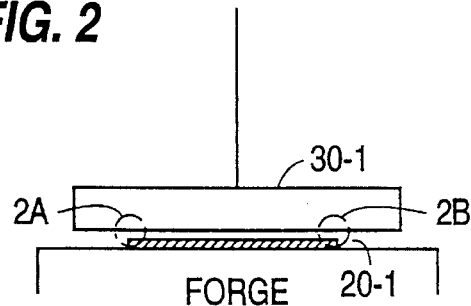
FIGS. 2A and 2B show the compression step of the post-hot working process using a stamping technique according to a first embodiment of the invention.
Figure 2A:
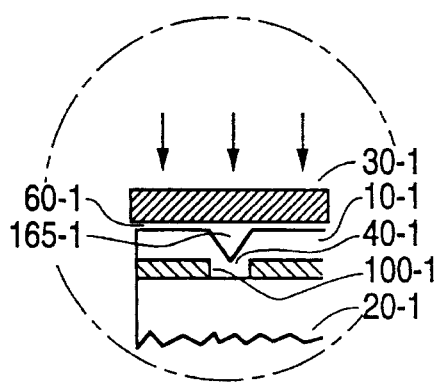
Figure 2B:
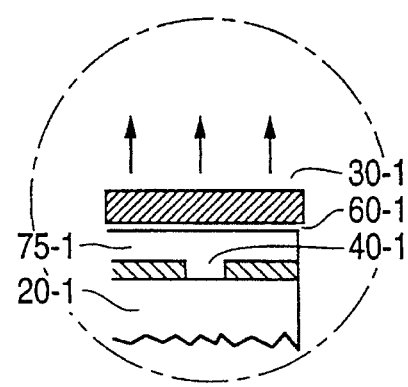

Referring now to FIG. 1, a ductile, conductive metal 10-1, such as Al, is deposited onto an semiconductor substrate 20-1 in a partial vacuum chamber 25-1 at a high temperature, for example, 275 degrees Centigrade. Referring now to FIG. 2A, the substrate 20-1 with the metal 10-1 deposited on it is then placed into a full vacuum chamber, at which time the metal 10-1 is easily compressed down onto the substrate 20-1 by a heated forge mechanism 30-1, such as a stamper or a roller. The metal 10-1 is compressed down onto the substrate 20-1 due to the force and heat applied by the forge mechanism 30-1 on the substrate 20-1. The conductive metal 10-1 is compressed into contact openings 40-1 formed on the substrate 20-1 in order to form a smooth conductive surface 75-1 throughout the substrate 20-1. As can be seen in FIG. 2B, the smooth conductive surface 75-1 is formed even at the contact openings 40-1.

Conventional methods of forming these contact openings in semiconductor circuits are expensive and complex, as explained earlier herein. However, by using the method according to the invention to first deposit Aluminum or other ductile metal onto a substrate in a partial vacuum environment, and then to compress the ductile conductive metal into the voided contact openings in a full vacuum environment under high temperature conditions, the ductile metal will flow readily into the contact openings. This will result in a less-costly process for forming smooth contacts on a substrate. Further, performing the compression under high temperature conditions results in larger grain sizes. These larger grain sizes provide greater electromigration resistance at the contact openings of the substrate, which produces the desirable effect of better electrical conductance at the contact openings of the substrate.

As noted above, the conditions for forging the Al onto the substrate are a high pressure and a high temperature. The high pressure is obtained by compressing the metal onto the substrate using a stamping or a rolling technique. Hot working of a metal, such as Al, is better than cold working, since a hot metal tends to flow easier into openings and the heat results in the growth of grains in the metal. The heat can be applied by convection, such as by heating the vacuum chamber to a particular temperature, as is done in a conventional convection oven. Alternatively, the heat can be applied by conduction, such as by heating the forge itself, thereby directly transferring the heat from the forge to the substrate during the time when the forge is compressed onto the substrate. Other suitable methods of applying heat to the substrate during the compression step can be applied within the scope of the invention.

In the forging process as shown in FIG. 2A, a forge 30-1 having a flat plane forming a bottom surface 60-1 is placed over the semiconductor substrate 20-1 and thereafter pressed onto the substrate 20-1. The bottom surface 60-1 of the forge 30-1 is preferably made of a special material selected so that the ductile metal 10-1 that has been previously deposited onto the semiconductor wafer 20-1 in a partial vacuum will not adhere to the forge 30-1. For example, a stainless steel bottom surface may be employed to keep the ductile metal 10-1, such as Al, from adhering to the forge 30-1 when the forge is moved away from the substrate 20-1 after the compressing phase is complete.

Figure 3:
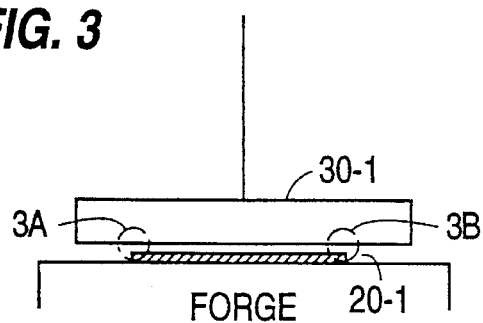
FIGS. 3A and 3B show the compression step of the post-hot working process using a stamping technique according to a second embodiment of the invention.
Figure 3A:
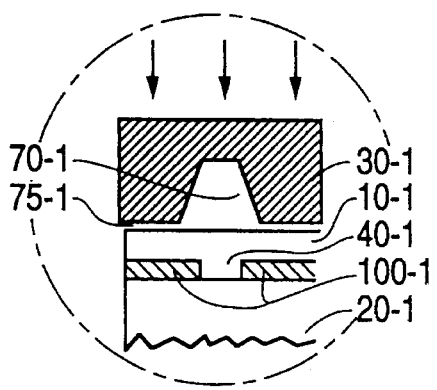
Figure 3B:
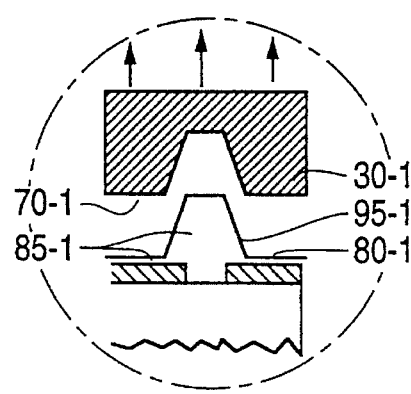

Alternatively, the forge 30-1 may have an image or pattern formed on its bottom surface that matches the pattern of a conductive layer of the ductile metal to be embossed onto the semiconductor surface to be stamped by the forge 30-1. In the first embodiment as shown in FIGS. 2A and 2B, the bottom surface 60-1 of the forge 30-1 is flat to thereby form a smooth conductive surface 75-1, even at contact openings 40-1 on the substrate 20-1. In the second embodiment as shown in FIGS. 3A and 3B, the bottom surface 70-1 of the forge 30-1 forms a pre-determined conductor image that is embossed onto the substrate 20-1. For the second embodiment, the forge 30-1 must be carefully aligned with respect to the substrate 20-1 before the compressing step is performed, in order to assure that the embossed image is properly placed onto the substrate 20-1.

According to the second embodiment of the invention, the objective is to emboss the conductor image on a metal film, such as an aluminum or copper metal film, that is initially deposited onto the substrate 20-1. In this case, the embossed bottom plate 70-1 of the forge 30-1 contains the desired image of the conductor layout. A part of such an image is shown in FIGS. 3A, 3B as the non-uniform surface structure 70-1. With the additional feature of an embossed plate comes the need to align the image to the previous patterns on the silicon wafer 20-1.

The resulting embossed conductor pattern will contain flashing 80-1. Flashing is found in areas between the embossed conductors 95-1 that contain excess metal from the forging operation. This flashing 80-1 must then be removed in order to separate the conductors 95-1 from each other. In order to avoid a complex removal operation, removal of the flashing 80-1 can be accomplished by a blanket etch. The embossing process according to the second embodiment of the invention is a form of closed-die forging, or "coining" in which an image is embossed on the substrate layer by a forged surface onto the substrate layer.

In this example, properly coining the conductor image requires a two-step operation. The first forging operation requires a flat surface forge to fill in the contacts, as shown by the forge 30-1 in FIGS. 2A and 2B. The second forging, or embossing, operation is then applied to the smooth, highly ductile metal surface 75-1 on the substrate 20-1 to arrive at the desired, embossed conductor image 85-1 on the substrate, as shown in FIGS. 3A and 3B.

With the second embodiment of the invention, the bottom surface 70-1 of the forge 30-1 needs to be critically aligned on top of the semiconductor substrate 20-1, due to the tolerances and micron-level sizes of current ICs that are placed onto semiconductor substrates. Also, for both the first and the second embodiments, the bottom surface 60-1, 70-1 of the forge 30-1 should ideally be angled with respect to the semiconductor substrate 20-1 so that the highly ductile metal 10-1 will not adhere to the forge 30-1 when the forge 30-1 is moved away from the substrate 20-1 after the compressing step has been completed.

The process according to the invention of depositing a highly ductile metal, such as Al or Cu, onto a semiconductor substrate will now be explained in greater detail. A semiconductor substrate will have a particular integrated circuit (IC) structure formed therein. The hot-working process for semiconductor substrates according to the invention includes depositing a ductile metal, such as aluminum (Al), over contacts on top of a barrier metal layer which itself is on top of the IC structure.

Referring now to FIGS. 2A, 2B, most conventional ICs have some kind of barrier metal layer 100-1 on top of the IC structure, that is, on top of the silicon surface. The barrier metal layer 100-1 will have contact openings 40-1 formed at particular locations on the substrate where the barrier metal layer 100-1 is discontinuous. The Al will then be compressed into the contact openings 40-1 at a high pressure by virtue of the stamping or rolling process according to the invention as described herein.

Normally, the barrier metal layer 100-1 formed within a contact opening 40-1 has a very thin depth, if any at all, as can be seen at area 165-1 in FIG. 2A. With conventional metal deposition techniques, one would typically get poor step coverage in the contact openings 40-1. Step coverage corresponds to the amount of the conductive layer within the contact openings, as compared to the amount of the conductive layer at non-contact openings. Poor step coverage will not exist when using the post-hot working process according to the invention. By post-hot working the ductile, conductive metal under a high pressure and high temperature condition, and thereby compressing the metal by stamping it or rolling it onto the semiconductor surface, the post hot-worked metal will readily flow into the contact openings 40-1 and will therefore result in very good step coverage for the entire semiconductor substrate 20-1.

Figure 4:
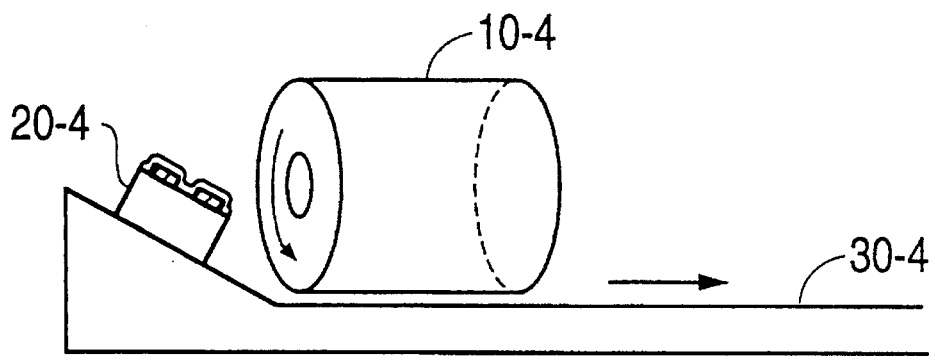
FIG. 4 shows the compression step of the post-host working process using a rolling technique according to a third embodiment of the invention.

In the forging technique according to the invention, the high pressure necessary for post-hot working is obtained mechanically by the stamping of the Al or similar conductive, ductile metal on the semiconductor substrate 20-1. Additionally, the high pressure can be obtained by rolling the metal onto the semiconductor surface shown in FIG. 4. The rolling process may be performed using a flat roller 10-4, or by using a roller having an embossed image. As shown in FIG. 4, the substrate 20-4 is fed by a movable surface 30-4 under the roller 10-4, where the substrate 20-4 is subjected to the pressure of the roller 10-4 on its surface. The effect of the roller 10-4 pressing on Al-coated substrate 20-4 acts to force the Al-conductive surface into the contact openings of the substrate 20-4. Note that the rolling process should ideally be performed in a vacuum chamber to ensure that the Al will readily flow into the contact openings. Like the stamping process described earlier, performing the rolling process at sufficiently high temperature results in large grains in the Al-conductive layer, which decreases electromigration resistance.

Subjecting the semiconductor substrate to high amounts of pressure by virtue of the stamping or rolling processes does not pose a problem with respect to the silicon substrate itself. A silicon substrate can typically withstand much more compression than can typical ductile, conductive metals, such as Al or Cu, since the silicon is a very hard crystal that will not break or become brittle under requisite pressure levels for the post-hot working process according to the invention.

Any conductive ductile metal, such as silver, gold, or platinum, for example, can be applied to a semiconductor substrate by the processes according to the invention. All of these metals have well known and predictable ductile characteristics versus temperature and pressure. With the proper application of temperature and pressure for each of these metals in the post-hot working process, the selected metal will readily flow into the contact openings of the semiconductor substrate and a smooth conductive surface, or any other type of conductive surface, can thereby be formed on the substrate.

Figure 5:
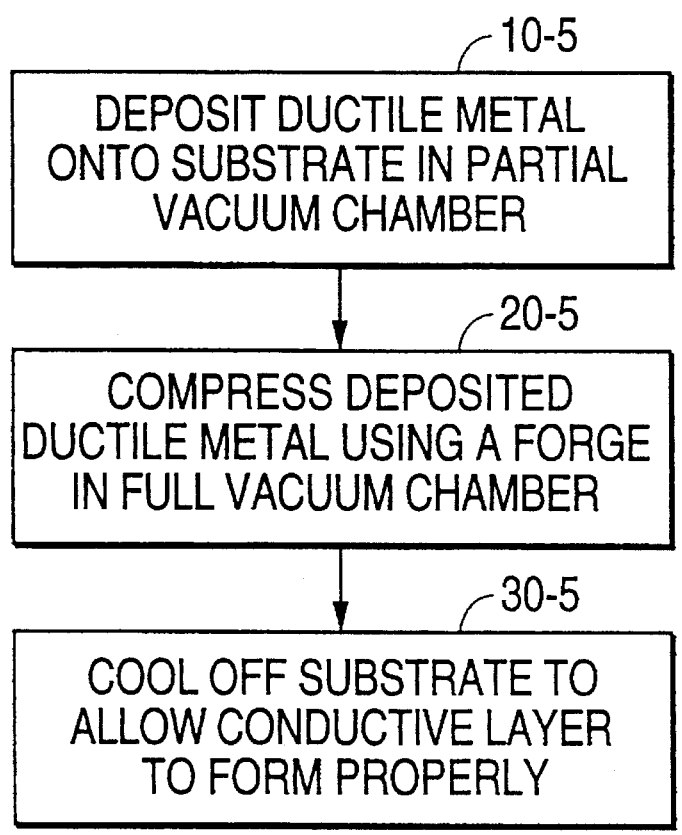
FIG. 5 is a flow chart of one method of performing post-hot working of a semiconductor according to the invention.

Referring now to FIG. 5, in the first and second embodiments, Al is deposited over contacts on top of a barrier metal layer which itself is on top of an integrated circuit structure on a semiconductor substrate, as shown in step 10-5. Referring now to FIG. 1, the deposition of the Al 10-1 onto the substrate 20-1 is done by placing the Al 10-1 onto the barrier metal layer 100-1 of the substrate 20-1 in a partial vacuum 25-1. Referring back to FIG. 5, after depositing the Al 10-1 onto the wafer 20-1, the wafer 20-1 is placed in a full vacuum at a temperature between 100 and 300 degrees centigrade to undergo the post-hot working of the deposited-Al 10-1 by compressing the Al 10-1 by using the forge 30-1, as shown in step 20-5. Note that the bottom surface 60-1 of the heated press 30-1 is preferably made of a material that will not adhere to the Al 10-1 nor form a eutectic bond with the Al 10-1 under heated compression.

For Al, the compression will occur at around 75–100 NM (newton-meter) per square meter at the temperature range given above. At this temperature and pressure range, the Al metal 10-1 can be compressed to around 50% of its as-deposited thickness and it will thereby fill in the contact openings 40-1 and also form a large grain structure. After the compression process has been completed, the substrate 20-1 will be cooled down, to allow for the conductive surface to form properly, as shown in step 30-5. The conductive surface may be cooled by using $N_2$ or similar cooling methods to quicken the cooling down process.

According to the second embodiment of the invention, the heated press 30-1 will have the appropriate topological image or mold to form an appropriate conductor layout. This means that the image would have to include any additional depth changes caused by the underlying IC device structures below the highly ductile metal layer.

Specific numeric examples will now be given, using various types of ductile metals to be deposited onto a semiconductor substrate in order to form a conductive surface.

Referring to FIG. 1, a silicon wafer 20-1 with an active integrated circuit housed therein, and with 8000 angstrom-deep contacts 40-1 is first placed in a low pressure sputtering system. In this low pressure, partial vacuum environment, an 8000 angstrom-deep Aluminum layer 10-1 is deposited onto the wafer 20-1 at a temperature of approximately 275 degrees C. In particular, after the deposition step, the result is a wafer 20-1 with a uniformly deposited aluminum thickness except at the contact openings 40-1, as can be seen by the indentation area 165-1 of FIG. 2A.

In this example, assume that the contact openings 40-1 have an equivalent aluminum thickness of about 8000 angstroms and occupy approximately $\frac{1}{1000}$ of the surface area of the substrate. For this example, by applying a forge 30-1 under pressure and at a high temperature on the substrate-aluminum layer, the aluminum thickness will decrease by about $\frac{1}{1000}$ of its original amount, or to 7999 angstroms in depth, but the upper aluminum surface 75-1 will then be entirely uniform, as can be seen from FIG. 2B.

The objective of either the stamping or the rolling hot-working process is to "open die forge" the aluminum into the contact openings 40-1 on the surface of the substrate 20-1, thereby resulting in the contact openings 40-1 being completely filled and the aluminum surface 75-1 being smooth at all locations on the substrate 20-1, with no indentations in the Al-conductive layer 10-1 where the contact openings 40-1 are located, thereby resulting in excellent step coverage. To achieve the proper pressure to meet this requirement, the necessary forge pressure is determined by the following equation:

$$Y_f = K \epsilon_1^n,$$

where K is the strength coefficient, n is the strain-hardening exponent, and $\epsilon_1$ is the true strain.

For Aluminum, K=26000 pounds per square inch (psi), and n=0.2. $\epsilon_1$ is calculated by the following equation:

$$\epsilon_1 ln(h_0/h_1),$$

where $h_0$=the beginning thickness of the aluminum, and $h_1$=the ending thickness of the aluminum.

For the example given above, $h_0$=8000 angstroms, and $h_1$=7999 angstroms.

Therefore, $\epsilon_1$=0.000125.

Thus, for Aluminum, $Y_f$=4300 psi, or for a 200 mm wafer, 54000 lbs/200 mm wafer is the amount of pressure required by either the stamping or rolling technique in order to properly press the Al onto the substrate and to fill the contact openings.

Note that the compressing mechanism (i.e, the forge 30-1 or the roller 10-4) must be properly sized with respect to the semiconductor wafer 20-1 to be compressed, so that when the wafer 20-1 is placed under the compressing mechanism, the compressing mechanism will force the aluminum into the contact voids and thereby improve the step coverage.

If Copper is used instead of Al as the highly ductile conductive metal, then K=46,000 and n=0.54. In this case, the required force would be $Y_f$=18000 lbs/200 mm wafer needed from the forge in order to properly compress the copper into the contact points of the substrate to obtain a 7999 angstrom-thick, smooth copper conductive layer which fills in all of the contact openings.

One of ordinary skill in the art will appreciate that within the scope of the invention, other types of ductile metals, such as gold, silver, and platinum, can be utilized instead of Al or Cu for performing a post hot working process for semiconductors. The proper amount of pressure to be applied is found by determining the conductive properties of the metal (versus temperature and pressure) from any standard reference guide on conductive metal ductile ratings. For example, page 35 of *Manufacturing Processes for Engineering Materials*, written by Serope Kalpakjian (published 1984), gives such ductile ratings of various types of metals, and FIGS. 6 and 7 were obtained from that reference.

Figure 7:
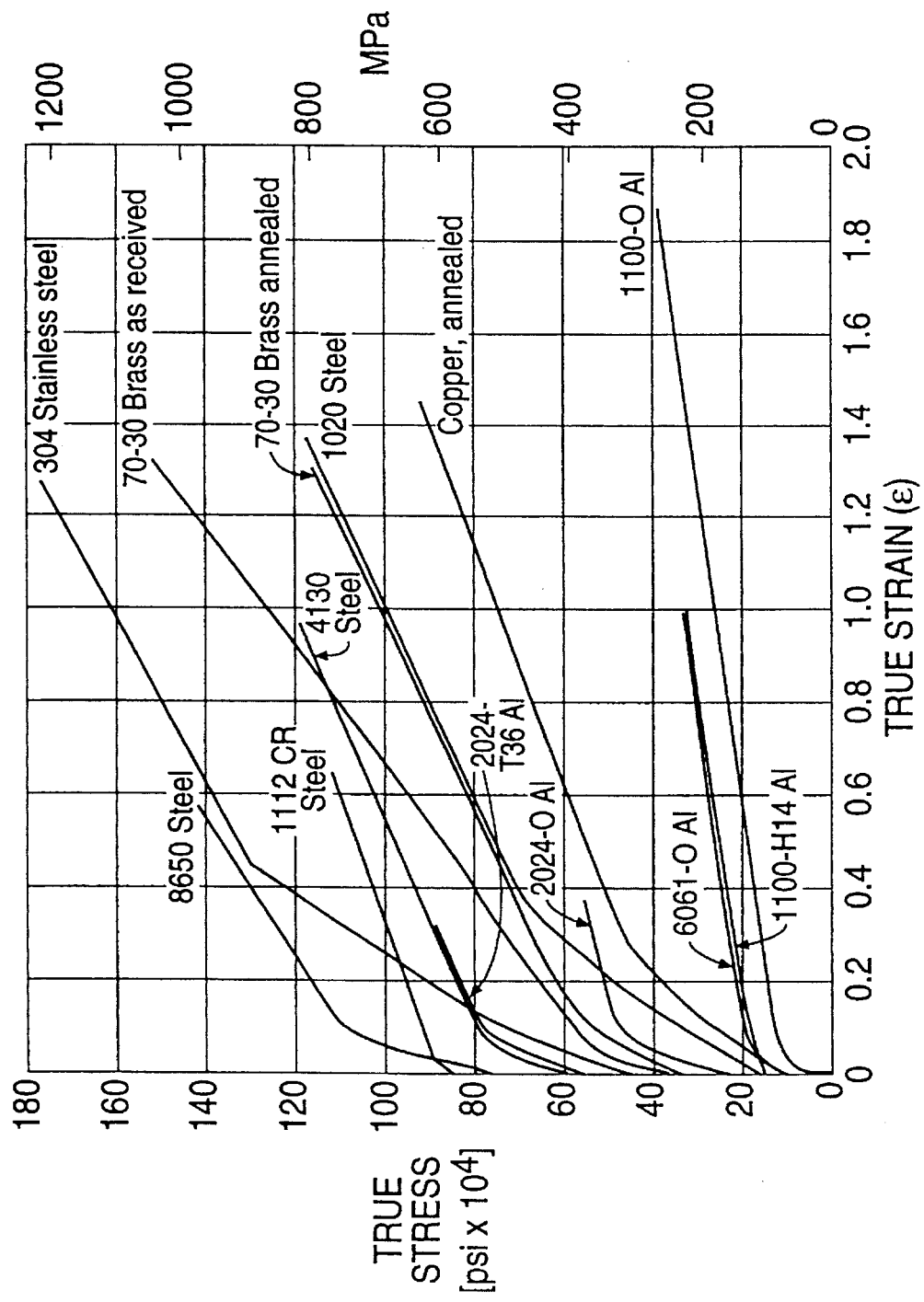
FIG. 7 is a chart showing true stress versus true strain, in tension and at room temperature for various types of metals.

FIG. 6 shows the strength coefficients and strain hardening exponents for different metals at room temperature, and FIG. 7 shows the true stress versus true strain curves in tension and at room temperature for different metals. Given these Figures, the correct amount of force required by the forge to perform a post-hot working process on a particular-sized semiconductor substrate using a particular conductive metal can readily be determined, as given in the two examples above.

While preferred embodiments of the invention have been described, modification of the described embodiments may become apparent to those of ordinary skill in the art, following the teachings of the invention, without departing from the scope of the invention as set forth in the appended claims.

What is claimed is:

1. A method for depositing a ductile metal onto a semiconductor substrate having a plurality of contact openings in order to fill in said contact openings, the method comprising the steps of:

a) depositing said ductile metal onto said semiconductor substrate in a partial vacuum environment;

b) compressing said ductile metal onto said semiconductor substrate using a forge in a full vacuum environment; and c) cooling said semiconductor substrate with said ductile metal compressed thereon.

2. The method recited in claim 1, wherein said ductile metal is Aluminum, and said fixed compression is about 4300 pounds per square inch of said semiconductor substrate.

3. The method recited in claim 1, wherein the step a) is performed at a temperature of about 275 degrees Centigrade.

4. The method recited in claim 1, wherein said ductile metal is Copper, and said fixed compression is about 1430 pounds per square inch of said semiconductor substrate.

5. The method recited in claim 1, wherein said semiconductor substrate includes a metal barrier layer on top of a silicon layer, and wherein an integrated circuit is constructed on said silicon layer and said plurality of contact openings are formed at discontinuous regions of said metal barrier layer.

6. The method recited in claim 1, wherein the step c) comprises applying $N_2$ to said semiconductor substrate in a cooling chamber.

7. The method recited in claim 1, wherein said semiconductor substrate includes a silicon layer, an oxide layer on top of said silicon layer, and a metal barrier layer on top of said oxide layer, and wherein an integrated circuit is formed on said silicon layer and said plurality of contact openings are formed at discontinuous regions of said metal barrier layer.

8. The method recited in claim 1, wherein said forge includes a bottom surface comprising a material that substantially avoids adherence of said ductile metal to said bottom surface of said forge.

9. The method recited in claim 8, wherein said forge is lifted away from the substrate after the step c) is completed at a fixed angle with respect to said semiconductor substrate, wherein said fixed angle is such that said bottom surface of said forge is not substantially parallel to said semiconductor substrate as said forge is lifted away from said semiconductor substrate, thereby avoiding adherence of said ductile metal to said bottom surface of said forge.

10. A method for depositing a ductile metal onto a semiconductor substrate having a plurality of contact openings in order to fill in said contact openings, the method comprising the steps of:
 a) compressing said ductile metal onto said semiconductor substrate using a forge in a full vacuum environment; and
 b) cooling said semiconductor substrate with said ductile metal compressed thereon,
 wherein the step a) is performed at a temperature range between a first temperature value and a second temperature value and at a fixed compression, and wherein said forge has a flat bottom surface that compresses said ductile metal onto said semiconductor substrate to form a smooth conductive surface onto said semiconductor substrate.

11. The method recited in claim 10, wherein said first temperature value is about 100 degrees centigrade and said second temperature value is about 275 degrees centigrade.

12. The method recited in claim 10, wherein the step a) comprises stamping the ductile metal onto said semiconductor substrate by said forge at said fixed compression.

13. The method recited in claim 10, wherein the step a) comprises rolling the ductile metal onto said semiconductor substrate by said forge at said fixed compression.

14. The method recited in claim 10, further comprising the step of:
 prior to step a), depositing said ductile metal onto said semiconductor substrate in a partial vacuum environment.

15. A method for depositing a ductile metal onto a semiconductor substrate having a plurality of contact openings in order to fill in said contact openings, the method comprising the steps of:
 a) compressing said ductile metal onto said semiconductor substrate using a forge in a full vacuum environment; and
 b) cooling said semiconductor substrate with said ductile metal compressed thereon,
 wherein the step a) is performed at a temperature range between a first temperature value and a second temperature value and at a fixed compression, and wherein said forge has an embossed bottom surface that compresses said ductile metal onto said semiconductor substrate to form an embossed conductive surface similar to said embossed bottom surface of said forge.

16. The method recited in claim 15, further comprising the step of:
 prior to step a), depositing said ductile metal onto said semiconductor substrate in a partial vacuum environment.

17. A method for embossing a conductive metal layer onto a semiconductor substrate having a plurality of contact openings, the method comprising the steps of:
 a) depositing a ductile metal on said semiconductor substrate in a partial vacuum environment;
 b) determining locations on said semiconductor surface to form a conductor layer thereon;
 c) embossing said ductile metal onto the substrate by an embosser in a full vacuum environment, at a temperature range between a first temperature value and a second temperature value and at a fixed compression strength, and thereby forming an embossed conductor layer of said ductile metal at the determined locations on said semiconductor substrate;
 d) cooling said semiconductor substrate with said ductile metal compressed thereon; and
 e) removing portions of said ductile metal at areas on said semiconductor substrate that do not conform to the determined locations on said semiconductor substrate.

18. The method recited in claim 17, wherein said first temperature value is about 100 degrees centigrade and said second temperature value is about 275 degrees centigrade.

19. The method recited in claim 17, wherein said ductile metal is Aluminum, and said fixed compression strength is about 4300 pounds per square inch of said semiconductor substrate.

20. The method recited in claim 17, wherein said ductile metal is Copper, and said fixed compression strength is about 1430 pounds per square inch of said semiconductor substrate.

21. The method recited in claim 17, wherein the step b) comprises stamping said ductile metal onto said semiconductor substrate by said embosser at said fixed compression strength.

22. The method recited in claim 17, wherein the step b) comprises rolling said ductile metal onto said semiconductor substrate by said embosser at said fixed compression strength.

23. The method recited in claim 17, wherein said semiconductor substrate includes a metal barrier layer on top of a silicon layer, and wherein an integrated circuit is formed on said silicon layer and said plurality of contact openings are formed at discontinuous regions of said metal barrier layer.

24. The method recited in claim 17, wherein the step c) comprises applying $N_2$ to the semiconductor substrate in a cooling chamber.

25. The method recited in claim 17, wherein said semiconductor substrate includes a silicon layer, an oxide layer on top of said silicon layer, and a metal barrier layer on top of said oxide layer, and wherein an integrated circuit is formed on said silicon layer and said plurality of contact openings are formed at discontinuous regions of said metal barrier layer.

26. The method recited in claim 17, wherein the step d) comprises a barrier etching process.

27. The method recited in claim 17, wherein said embosser includes an embossed bottom surface which comprises a material that substantially avoids adherence of said ductile metal to said embossed bottom surface of said embosser.

28. The method recited in claim 17, wherein said material substantially avoids forming an eutectic bond with said ductile metal.

29. The method recited in claim 17, wherein said embosser includes an embossed bottom surface that is lifted away from said semiconductor substrate after the step b) is complete, at a fixed angle with respect to said semiconductor substrate to avoid adherence of said ductile metal to said embossed bottom surface of the embosser, wherein said fixed angle is such that said bottom surface of said forge is not substantially parallel to said semiconductor substrate as said forge is lifted away from said semiconductor substrate.

30. The method recited in claim 17, wherein the step a) is performed at a temperature of about 275 degrees Centigrade.

31. A method for embossing a ductile metal onto a semiconductor substrate, the method comprising the steps of:
 a) depositing said ductile metal onto said semiconductor substrate in a partial vacuum environment;
 b) compressing said ductile metal onto said semiconductor substrate in a full vacuum environment using a first forge having a smooth bottom surface;

c) cooling said semiconductor substrate with said ductile metal compressed thereon as a smooth conductive surface;

d) compressing said smooth conductive surface on said semiconductor substrate in a full vacuum environment by a second forge having an embossed bottom surface to form an embossed conductive surface on said semiconductor substrate;

e) cooling said semiconductor substrate with said embossed conductive surface compressed thereon; and f) removing portions of embossed conductive surface on said semiconductor substrate that do not substantially match said embossed bottom surface of said second forge.

32. The apparatus recited in claim 31, wherein said bottom surface of said first forge comprises a smooth surface to form a smooth conductive pattern onto said semiconductor substrate when said first forge is compressed onto said semiconductor substrate.

33. The apparatus recited in claim 31, wherein said bottom surface of said second forge comprises an embossed surfaced to form an embossed conductive pattern onto said semiconductor substrate when said second forge is compressed onto said semiconductor substrate.

34. An apparatus for depositing a ductile metal onto a semiconductor substrate having a plurality of contact openings in order to fill in said contact openings, comprising:

a partial vacuum chamber for providing a partial vacuum environment, wherein said ductile metal is deposited onto said semiconductor substrate in said partial vacuum chamber;

a full vacuum chamber for providing a substantially full vacuum environment;

a forge having a bottom surface;

means for aligning said bottom surface of said forge with said semiconductor substrate;

means for compressing said bottom surface of said forge onto said semiconductor substrate at a fixed pressure in said full vacuum chamber, to thereby form a conductive pattern onto said semiconductor substrate using said bottom surface;

a cooling chamber for allowing said conductive pattern compressed onto said semiconductor substrate to cool therein.

* * * * *